United States Patent [19]
Johnson et al.

[11] Patent Number: 5,481,183
[45] Date of Patent: Jan. 2, 1996

[54] ELECTRO-OPTIC SPECTRUM ANALYZER

[76] Inventors: Paul A. Johnson, 10467 Hawley Rd., El Cajon, Calif. 92021; Ri-Chee Chou, 10525 Earthstar Ct., San Diego, Calif. 92127; Chris A. Martin, 8949 Lombard Pl. #426, San Diego, Calif. 92122; Brett Spivey, 131 Seeman Dr., Encinitas, Calif. 92024; John Lovberg, 5771 Lodi St., San Diego, Calif. 92117

[21] Appl. No.: 425,135

[22] Filed: Apr. 19, 1995

Related U.S. Application Data

[63] Continuation of Ser. No. 60,659, May 13, 1993, abandoned.

[51] Int. Cl.$^6$ .................................................. G01R 23/17
[52] U.S. Cl. .............................. 324/76.36; 324/76.37; 364/827
[58] Field of Search .................................. 364/827, 822; 324/76.36, 76.37

[56] References Cited

U.S. PATENT DOCUMENTS

| | | |
|---|---|---|
| 4,464,624 | 8/1984 | Osterwalder . |
| 4,633,170 | 12/1986 | Burns . |
| 4,871,232 | 10/1989 | Grinberg et al. . |
| 5,041,778 | 8/1991 | Loualiche et al. . |
| 5,121,124 | 6/1992 | Spivey . |

*Primary Examiner*—Kenneth A. Wieder
*Assistant Examiner*—Jose M. Solis
*Attorney, Agent, or Firm*—John R. Ross

[57] ABSTRACT

A broadband spectrum analyzer for radio frequency and microwave signals. The signal to be analyzed modulates an optical laser beam through an electro-optic modulator. The resultant modulated beam thus comprises light at a frequency (carrier frequency) corresponding to the wavelength of the laser beam and frequencies close to the carrier frequency corresponding to the frequencies representing the modulating signal. The modulated beam is expanded to produce a beam with light traveling in a large number of directions within a narrow angle. The expanded beam illuminates the aperture of an etalon. The etalon functions as an optical filter passing only portions of the beam which enter the etalon at an angle such that the distance traveled by the light within the etalon equals an integral number of wavelengths. Thus, different frequencies pass through the etalon at different angles. The output from the etalon is collected by a video camera for display and interpretation. This new approach allows a larger instantaneous bandwidths to be analyzed than is possible with current systems, and allows a simple video camera to be used for observation of the spectrum of interest.

8 Claims, 8 Drawing Sheets

ELECTRO-OPTIC SPECTRUM ANALYZER

This application is a continuation of Ser. No. 060,659, filed May 13, 1993, now abandoned.

This invention relates to spectrum analyzers and in particular to spectrum analyzers for the microwave and radio frequency (RF) spectra (especially for frequencies up to about 1,000 GHz).

BACKGROUND OF THE INVENTION

Most spectrum analyzer systems for analyzing microwave and RF spectra function by mixing a signal of interest (the signal to be analyzed) with an RF carrier, creating a lower frequency signal with power proportional to the incoming RF signal. The RF carrier is swept in time such that this lower frequency signal is swept over the narrow passband of an electronic filter. The power passing through the filter is measured as the carrier is swept in order to reconstruct the spectral power of the signal of interest. The disadvantage of this system is that only a small portion of the signal of interest can be observed instantaneously. In order to overcome this difficulty, many attempts have been made to create an optical spectrum analyzer in which a wideband electronic signal is converted to light. The light pattern representing the signal is then viewed in its entirety.

Two of the present inventors, along with two others, invented a microwave camera which was patented under U.S. Pat. No. 5,121,124 issued Jun. 9, 1992. In one of the described embodiments of that invention, a signal of interest is sent to a Bragg Cell (an acousto-optic modulator) which, when illuminated with a laser, diffracts a portion of the laser beam onto the pixel array of a video camera. The image of the diffracted light represents the spectrum of the signal of interest. This use of acousto-optic modulators (AOMs) as optical spectrum analyzers has been quite successful in providing high resolution and real-time operation (see also U.S. Pat. No. 4,633,170 to Burns). Unfortunately, AOMs are currently limited to processing a bandwidth of about 2 GHz.

Electro-optic modulators, however, are currently available with bandwidths of over 20 GHz. Their use in spectral analyzer systems would allow for the instantaneous analysis of signals with much broader bandwidths. One approach has been to modulate a light beam such as a laser beam with an RF or microwave signal then to use dispersive elements such as diffraction gratings (U.S. Pat. No. 4,464,624 to Osterwalder) to spatially separate the different frequency components in the modulated beam. The drawback of such dispersive element systems is that the angular diffraction between different frequency components is extremely small. To obtain adequate resolution, the size of such systems must be on the order of several meters.

Another approach (U.S. Pat. No. 4,871,232 to Grinberg, et. al.) involves a time sampling of the modulated optical beam rather than a spatial sampling. Using two parallel plates as an optical waveguide, a collimated beam is sampled at regularly spaced intervals by making one of the plates totally reflective and the other partially reflective. The various beam samples "steer" the beam, much like a frequency scanned antenna. This approach becomes impractical in that the beam at each sampling point must possess a small dimension and approximate intensity of the first sampled point if the beam steering is to be effective. Similar approaches, such as a group of fiber optic delay lines with varying delays, exhibit similar difficulties in the precise tolerances involved.

Another proposed spectrum analyzer system uses an electro-optic modulator in conjunction with a swept Fabry-Perot etalon (U.S. Pat. No. 5,041,778). The etalon acts as a very narrow band optical filter. Here, the spacing of the etalon is swept in time, varying its resonance characteristics and the frequency that is allowed to pass through the etalon. Only one detector is used to measure transmitted power. This device suffers from the same limitations as electronic spectrum analyzers in that the entire spectrum of interest cannot be viewed simultaneously.

SUMMARY OF THE INVENTION

The electro-optic spectrum analyzer described here represents an improvement over current technology in that it allows a very large portion of an RF or microwave spectrum to be observed instantaneously, and it does so while using only a few components in a compact size. This system works by using an electro-optic modulator to mix the signal of interest with a laser beam. The modulated laser beam is directed to the aperture of an optical filter with portions of the beam directed in a range of directions. The optical filter permits passage of specific frequency components only for portions of the beam which are directed in predetermined directions. In a preferred embodiment an etalon is used to spatially separate the frequencies in the modulated beam. The etalon acts as a resonant cavity and passes light of a specific frequency only to the extent that the light enters (and leaves) the etalon at a specific angle. The modulated laser signal is passed into the etalon over many angles at once, and the etalon blocks light from all but a single frequency at each angle. The light passing through the etalon is detected by a video camera (with different frequencies being detected at different pixel locations) and the different frequencies are displayed simultaneously on a monitor.

DETAILED DESCRIPTION OF PREFERRED EMBODIMENTS

Overall Description of First Preferred Embodiment

Figure 1:
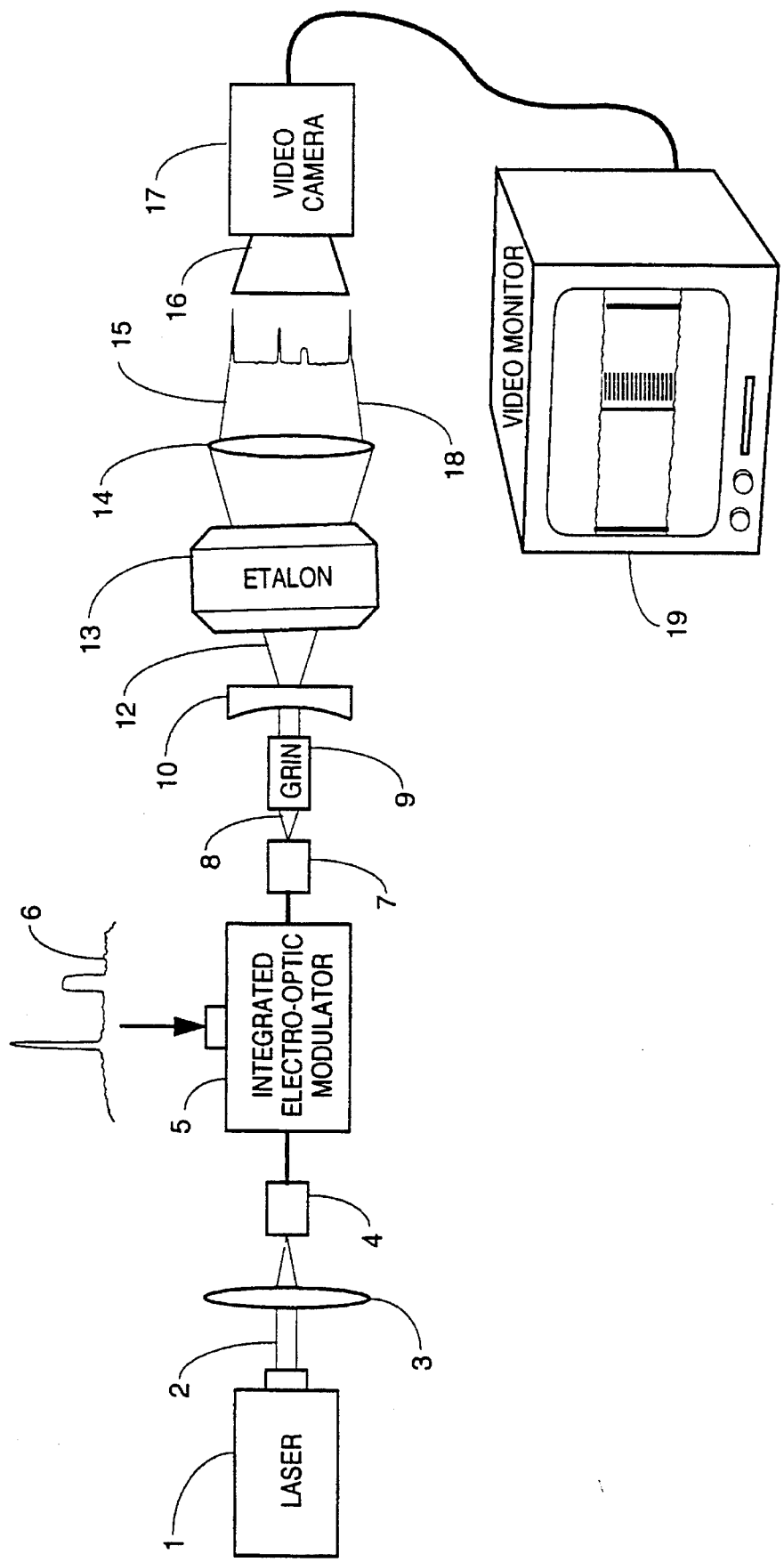
FIG. 1 is a drawing providing an overall description of the present invention.
Figure 2:
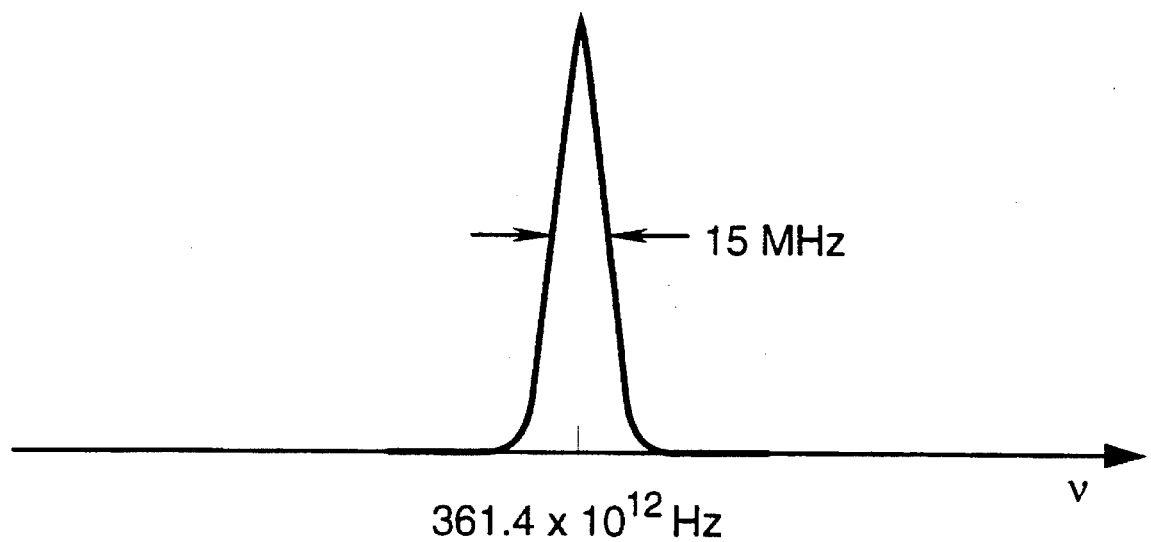
FIG. 2 is a sketch of the profile of a spectrum suitable for a carrier beam.

As shown in FIG. 1, a narrowband continuous wave laser beam 2 is produced by diode laser 1 tuned to $361.400 \times 10^{12}$ Hz$\pm 10 \times 10^6$ Hz. FIG. 2 shows the spectrum of the laser beam.

Figure 3:
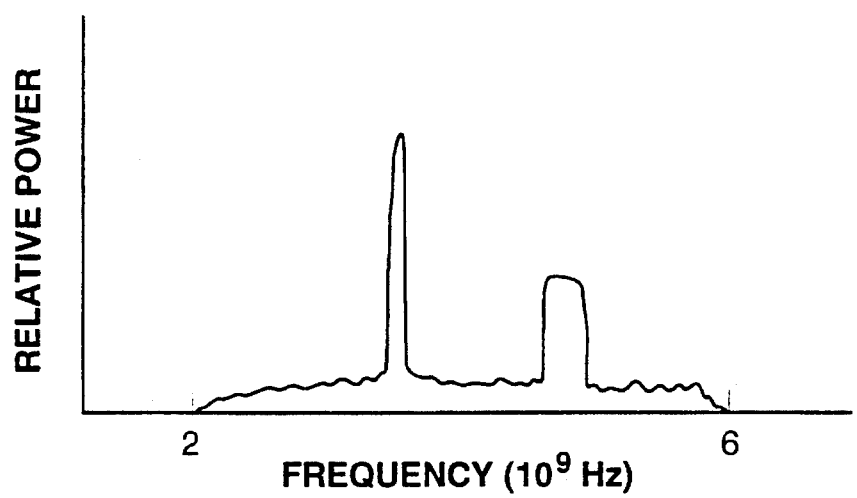
FIG. 3 is a sketch of a typical microwave signal which this invention will analyze.

Beam 2 is focused into fiber optic 4 by lens system 3 and the laser light is fed by fiber optic cable through electro-optic modulator 5. In modulator 5 a signal 6 to be analyzed is mixed with laser beam 2. FIG. 3 shows the spectrum of such a typical signal to be analyzed and we will use this spectrum as an example in this description. Signal 6 contains frequency components ranging between $2 \times 10^9$ Hz to $6 \times 10^9$ Hz as shown in FIG. 3. This example frequency is shown to have a narrow peak centered at $3.5 \times 10^9$ Hz and a broader peak centered at $5 \times 10^9$ Hz.

Figure 4:
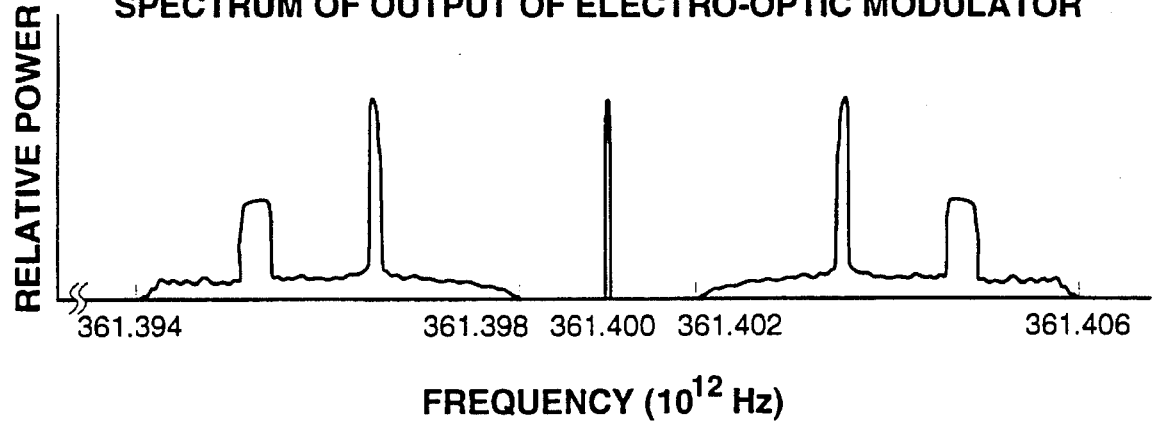
FIG. 4 is a spectrum of the carrier beam of FIG. 2 modulated with the signal of FIG. 3.

The modulated beam is shown in FIG. 1 exiting fiber optic 7 as beam 8. It contains the carrier frequency at $361.400 \times 10^{12}$ Hz: and it also contains upper and lower side bands at frequencies equal to the sum and difference of the carrier frequency and the modulating signal frequencies. Thus, the spectrum of the modulated beam 8 has frequency components ranging from $361.394 \times 10^{12}$ Hz to $361.406 \times 10^{12}$ Hz. The optical spectrum of modulated beam 8 is graphically portrayed in FIG. 4. The center of narrow $3.5 \times 10^9$ Hz peak appears at $361.3965 \times 10^{12}$ Hz and $361.403^5 \times 10^{12}$ Hz and the center of $5 \times 10^9$ Hz broad peak appears at $361.395 \times 10^{12}$ Hz and $361.405 \times 10^{12}$ Hz in the modulated beam. Beam 8 is collimated by GRIN (Graded index) rod lens 9 and directed to cylindrical plano-concave lens 10 which converts beam 8 into a fan-shaped beam 12. Beam 12 consists of a plane of rays radiating at all angles between $0.36°$ and $-0.36°$ with respect to the optical axis of beam 12. Beam 12 thus produces a thin rectangular pattern on the aperture of etalon 13.

Figure 7:
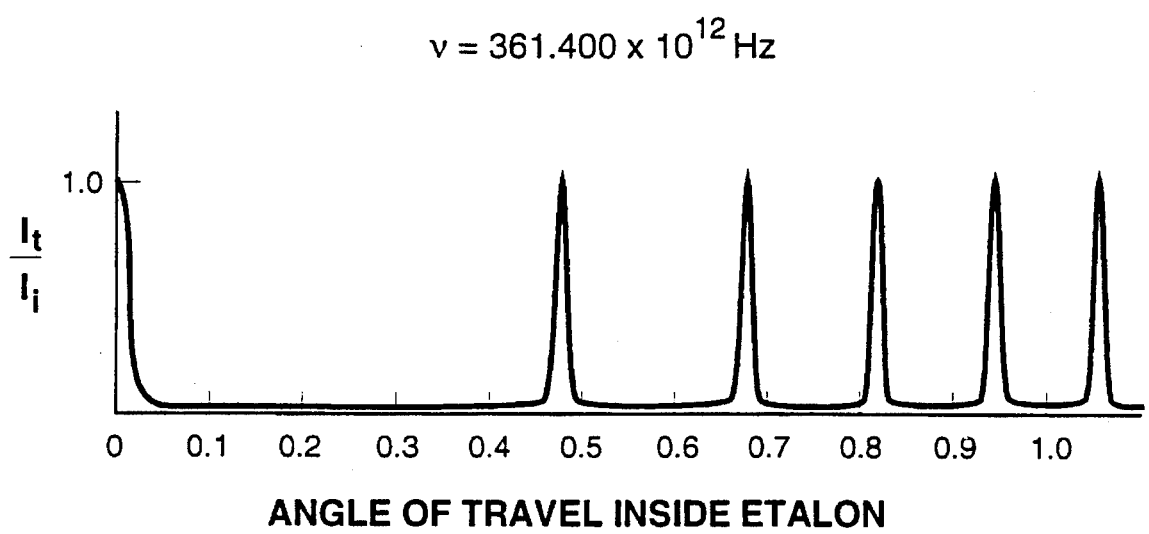
FIG. 7 is a sketch showing transmission through the above preferred embodiment for a frequency corresponding to a preferred carrier frequency.

Etalon 13 in this preferred embodiment is a fused silica etalon (Part No. ET-25, 4–8. 00-UV supplied by CVI Laser of Albuquerque, N.M.). This etalon in this embodiment is used as an optical filter. Its filter characteristics at the carrier frequency $361.400 \times 10^{12}$ Hz (830 nm wavelength) is shown in FIG. 7. The light transmission through the etalon depends very strongly on the angle at which the light illuminates the front surface of the etalon. As shown in FIG. 7, transmission through the etalon is substantially 100% for light at the carrier frequency propagating through the etalon at very narrow angles centered at $0°$, $0.477°$, $0.674°$, $0.825°$, $0.953°$, $1.066°$ etc. Transmission is substantially zero for carrier frequency light illuminating the etalon at all other angles within this range of angles. In our preferred embodiment the optical axis of beam 12 is adjusted to an angle of $0.357°$.

It is a characteristic of etalon 13 that any light transmitted through the etalon will exit the etalon at the same angle that it entered the etalon. Since the axis of beam 12 is at $0.357°$ and beam 12 is expanding at $\pm 0.36°$, light from the beam will illuminate the etalon at all angles between $0°$ and $0.715°$; Snell's law dictates that the forward direction of light inside the etalon (n=1.5) will be at angles from $0°$ to $0.477°$. Therefore, we do not have to be concerned with transmission of carrier frequency ($361.4 \times 10^{12}$ Hz) light transmitted at angles other than $0°$ and $0.477°$. As shown by FIG. 7, etalon is substantially reflective to carrier frequency light traveling in this etalon at angles between $0.055°$ and $0.475°$.

Figure 6:
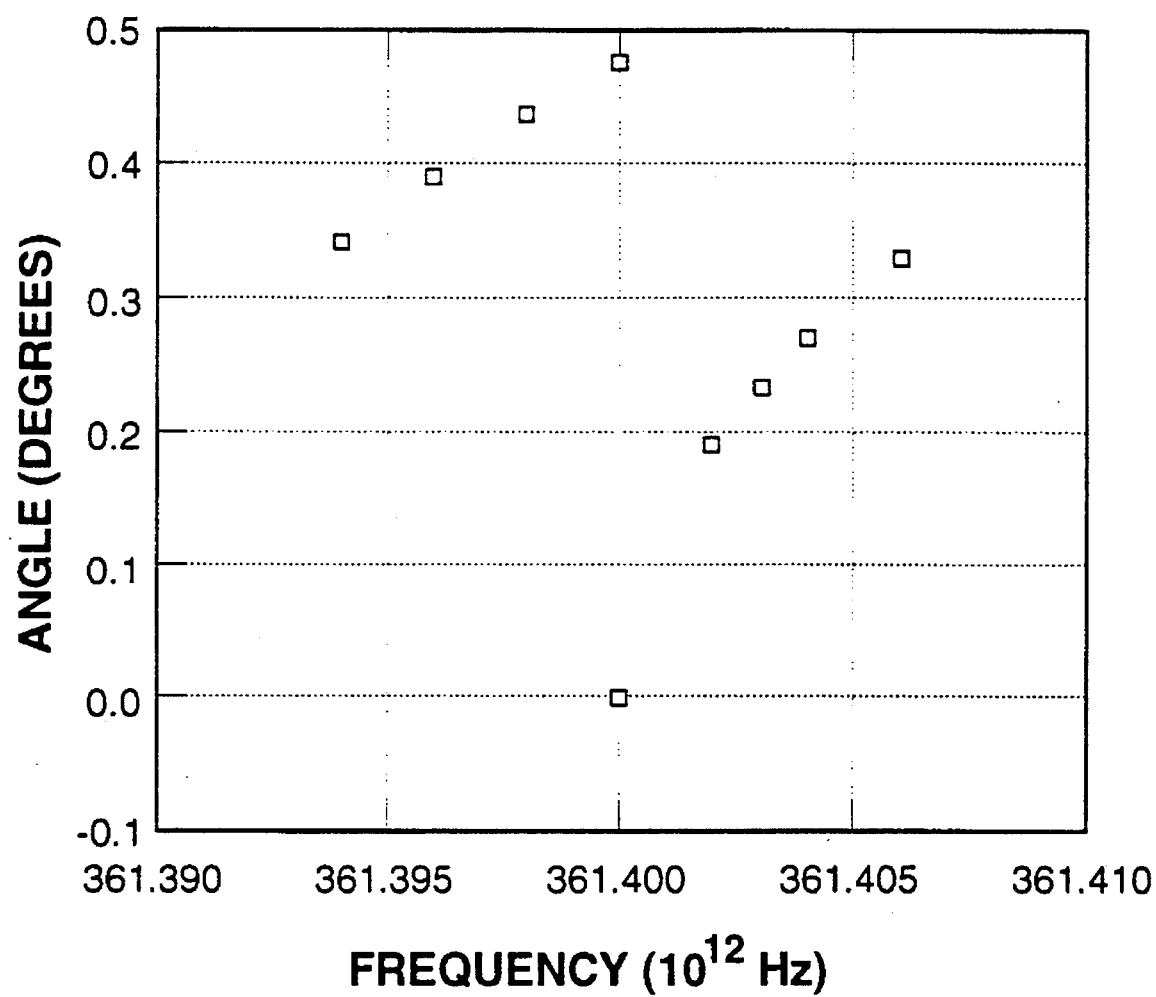
FIG. 6 is a graph of an angle of maximum transmission through a preferred optical filter over a narrow angular range as a function of frequency of the transmitted light.

However, for light traveling at any angle within these ranges of illumination angles, there is one frequency near the carrier frequency which will be readily transmitted by etalon 13. This relationship between illumination angle and frequency transmitted is shown in FIG. 6. Thus, the portion of the spectrum of modulated beam 12 within the $361.4035 \times 10^{12}$ Hz narrow peak will be transmitted through etalon 13 to the extent that the beam transverses the etalon at angles at or very close to $0.252°$. Similarly, the broad peak centered at $361.405 \times 10^9$ Hz will be transmitted at angles at or close to $0.301°$. As indicated above, all light transmitted by etalon 13 exits at the same angle as it had upon entering the etalon, which is approximately 1.5 times the angle of transmission through the etalon, due to Snell's law. The carrier beam is transmitted at $0°$ and $0.477°$ as indicated above.

The portion of beam 12 transmitted through etalon 13 is focused by imaging lens 14. The pixel array 16 of video camera 17 is placed in a portion of the image plane so as to permit illumination of the array by the portion of light transmitted through etalon 13 at angles between $0°$ and $0.477°$. As a result the carrier frequency 20 centered at $361.400 \times 10^{12}$ Hz will be imaged at both edges of monitor 9 corresponding to angles $0°$ and $0.477°$. The narrowband peak centered at $361.4035 \times 10^{12}$ Hz is shown as a bright strip at 21 corresponding to angle $0.252°$ and the broad peak centered at $361.405 \times 10^{12}$ Hz is shown as a dimmer wider strip at 22 corresponding to angle $0.301°$ on video monitor 17.

Principal Parts of System

Laser

The preferred laser system 1 in this embodiment is a laser system supplied as part number 06DLC 507 by Milles Griot Corporation, Irvine Calif. which uses laser diode SDL 5400 produced by Spectra Diode Labs. San Jose, Calif.

Laser Modulator

Figure 5:
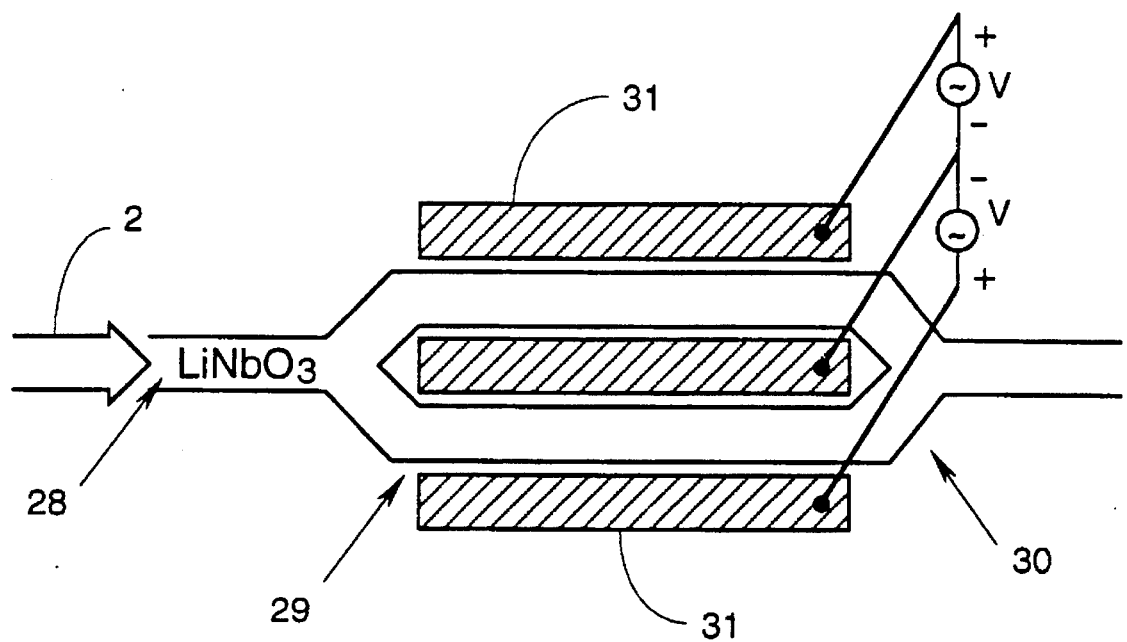
FIG. 5 is a sketch of an electro-optical modulator.

The electro-optic modulator 5 used in the preferred embodiment is an integrated waveguide Mach-Zender type modulator. The basic structure of such modulators is shown in FIG. 5. An incoming optical beam 2 is injected into a Lithium Niobate (LiNbO$_3$) optical waveguide 28. The beam is separated equally in a "waveguide Y" 29 and finally recombined at 30. An applied voltage to the electrodes 31 creates electric field on both legs but the field in one leg is opposite to that of the other leg. The fields change the refractive index of the LiNbO$_3$ waveguide linearly with the intensity of the electric field intensity in accordance with the Pockels effect. This changes the effective optical path length of the different arms of the "Y" and results in phase shifts of the optical signals in each arm. If the phase shift in both arms is identical, the optical beams recombine constructively, and all the input power appears at the output minus the waveguide and "Y" losses. When applied voltage produces a net phase-shift difference between the two arms of $\pi$ radians, the modes in the two waveguides are $180°$ out of phase and excite an antisymmetric mode in the output guide. The output guide is a single mode guide that cannot sustain such a mode; the power is dissipated by radiation into the substrate, and no output is produced. By varying the level of the applied voltages, the optical beams can be made to recombine with different relative phase shifts, producing a varying intensity of the output beam. This results in amplitude modulation of the input optical beam by the applied voltage.

Figure 8C:
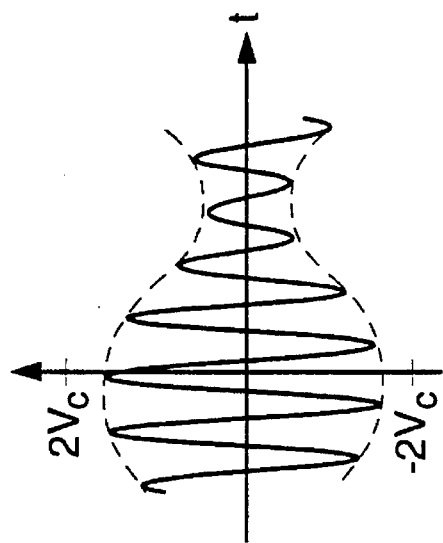
FIG. 8A, 8B, and 8C are sketches demonstrating the modulation of a carrier frequency with a signal to be analyzed.
Figure 8B:
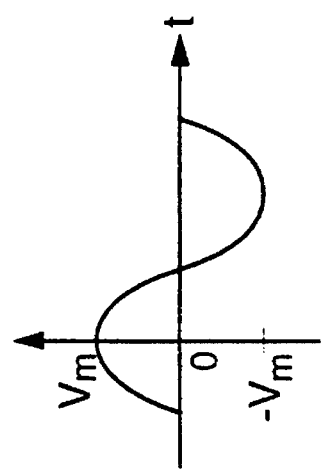
Figure 8A:
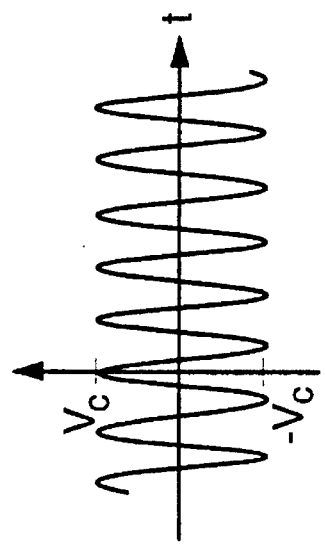

FIG. 8A shows a simplified depiction of carrier frequency on a time domain. FIG. 8B shows a simplified version of a modulating frequency and FIG. 8C shows a simplified version of the modulated beam.

Optical Filter

As stated above, the optical filter in this preferred embodiment is a solid fused silica etalon. Part. No. ET25.4-8.00-UV supplied by CVI Laser Corporation of Albuquerque, N.M. The functioning of the etalon as a part of our system is described above. The following is a more detailed explanation of the features of the etalon.

Figure 9:
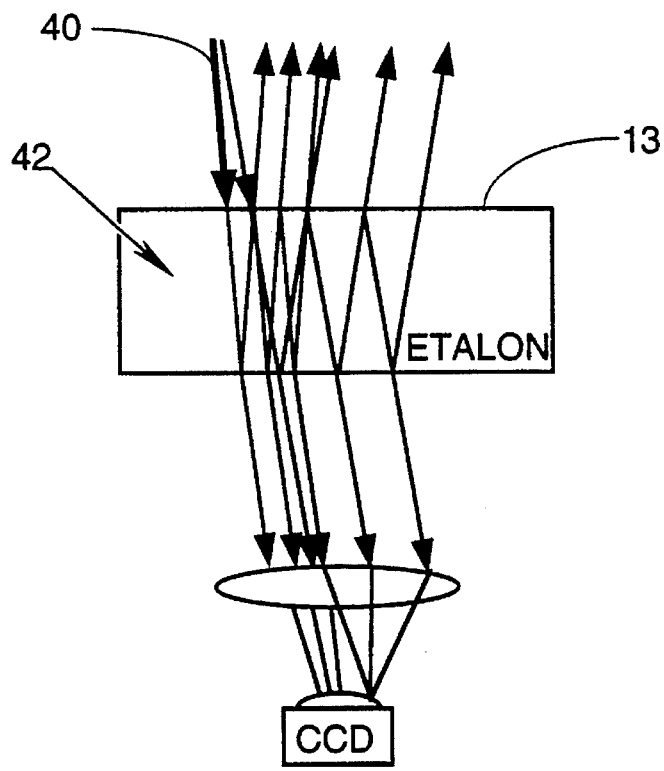
FIG. 9 is a sketch showing the functioning of an etalon useful in a preferred embodiment of the present invention.

The etalon 13 used in the preferred embodiment is a solid piece of fused silica 8 mm thick with highly parallel faces which are highly reflective at the laser frequency (830 nm). The etalon functions as an interferometric device. When an electromagnetic wave 40 (light) strikes the etalon, it will undergo many overlapping reflections between the first surface and the second surface of the glass as shown in FIG. 9. This sets up a standing electric field wave inside the glass. The total amount of light transmitted depends upon the strength of the standing wave at the second surface of the etalon. Likewise, the total amount of light reflected depends upon the strength of the standing wave at the first surface of the etalon. The electric field strength is determined by adding all the electric fields of the multiple internal reflections. As the light is coherent, these fields may add together (constructive interference) or cancel each other out (destructive interference). The interference will be either constructive or destructive depending upon the frequency of light and the angle at which the light travels inside the etalon.

In our preferred embodiment the etalon is 8 mm thick. Light striking the etalon at an angle of 0.715° will travel through the etalon to the opposite surface at an angle of 0.477°. Thus, the round trip distance traveled will be 16,000, 554.5 nm. The wavelength of our carrier frequency is 553.4 nm inside the etalon, therefore, at this angle the light will travel an integral number of wavelengths (i.e. 28913) and the light on each reflection will arrive at the exit surface of the etalon in phase with the result that essentially 100% of the light will be transmitted. For light at the carrier frequency illuminating the etalon at angles between about 0.082° and 1.00° (excluding a very narrow angle range around 0.715°), the light from multiple reflections will not be in phase at the exit surface of the etalon and essentially zero light will be transmitted. (A good explanation of this type of multiple beam interference including a mathematical analysis is provided in the classic text, *Optics*, by Hecht and Zajac, Section 9.7, Adison-Wesley Publishing Co., Menlo Park, Calif.) as described above, the modulated beam contains frequencies (representing the modulating signal) which are readily transmitted at angles within the above range.

System Resolution

Spectral resolution of the RF signal (i.e, the number of frequency bins that the incoming RF signal can be divided into) is determined by the stability of the laser, the resolution of the video camera, and the finesse of the etalon. In the preferred embodiment described here the overall system resolution is determined by the finesse of the etalon, since the laser is very stable and the video camera resolution is much higher than the etalon finesse (512 spots across the video camera vs. 75 finesse for the etalon). Etalon finesse is a measure of total usable angular change (before aliasing) divided by the spot size (beamwidth) of a single color. It is a measure of how finely the different colors present in the input spectrum may be divided, which is then the overall spectral resolution of the system. Free Spectral Range (FSR) is a measure of how much bandwidth the etalon has before aliasing. An etalon with a finesse of 75 and a FSR of 12.5 GHz is used in this embodiment, which allows a total of 75 frequency bins to be resolved across the 12.5 GHz FSR. Since the 75 spots must include the optical carrier, the lower sideband, and the upper sideband, the actual usable frequency resolution is slightly less than ½ the finesse, or 37.5 frequency bins across 6.25 GHz. A frequency resolution of 6.25/37.5 GHz/spot (or 166.7 MHz) is then achievable with this system. Systems with much higher frequency resolution can be constructed if custom made, high (1000) finesse etalons and very stable lasers are used.

The problem which occurred in other approaches with dispersive elements, such as diffraction gratings, was that the diffraction caused by a small beam width was larger than the diffraction due to color changes. The system described here has a resolution of 166.7 MHz, corresponding to an angular change of 0.0048° at 0.715° relative to the etalon. At 830 nm, the beam width corresponding to an angle of 0.0048° is 9.9 mm, a relatively small beam width. The etalon in this preferred embodiment has an aperture of 25 mm.

Other Embodiments

Figure 10:
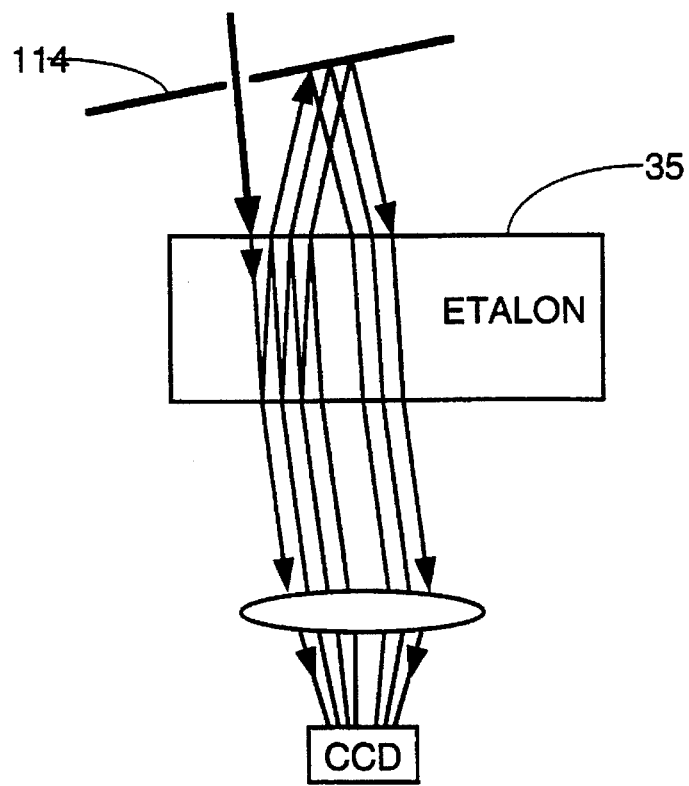
FIG. 10 shows the etalon of FIG. 9 but with a reflective backup used to direct light reflected from the etalon back into the etalon.

The efficiency of the etalon described in the preferred embodiments is 1/75. That is, of the light incident upon the etalon, approximately 1/75 will be transmitted. The remainder of the light is reflected away from the imaging lens. In another embodiment (a portion of which is shown in FIG. 10) a surface 44 is used to collect light reflected from the etalon and send it back to either a separate etalon mounted at the same angle as the first etalon, or a separate area of the same etalon. The surface may be either a smooth (preferably slightly tilted) reflective surface or a diffusive surface. In either case, the light reflected from the first etalon, which still contains all the modulated frequencies of the signal to be analyzed, would be sent back to another etalon at a different angle. Any light passing this etalon would be collected by the same imaging lens and mapped onto the camera plane according to transmission angle. This process of redirecting reflected light back into another etalon could be repeated many times with the overall result of improving the efficiency of the preferred approach.

While the above description contains many specifities, the reader should not construe these as limitations on the scope of the invention but merely as exemplifications of preferred embodiments thereof. Accordingly, the reader is requested to determine the scope of the invention by the appended claims and their legal equivalent and not by the example given above.

We claim:

1. A spectrum analyzer for analyzing the spectrum of an electromagnetic signal containing one or more signal frequencies within a range of high frequency radio and microwave frequencies comprising:

a) a modulating means for modulating an optical beam defining a narrowband carrier frequency with said electromagnetic signal in order to produce a modulated optical beam containing a one or more frequency components, said one or more frequency components differing only slightly in frequency from said carrier frequency;

b) a dispersing means set in the path of said modulated optical beam for dispersing said modulated optical beam to produce a dispersing modulated optical beam in which said one or more frequency components are being dispersed so that a portion of each frequency components is directed in each of a large number of directions;

c) a frequency-direction filter means located in the path of said dispersing modulated optical beam for blocking substantially all of said frequency components except the portion of each of said frequency components entering said frequency-direction filter means in at least one frequency-dependent entrance direction, a portion of each frequency component not blocked exiting said frequency-direction filter in at least one frequency-dependent exit direction; each of said frequency-dependent exit directions, within a range of directions, having a unique relationship with one of said signal frequencies;

d) a light detecting means for detecting the intensity of light in each of said frequency-dependent exit directions so as to permit an analysis of the spectrum of said signal.

2. A spectrum analyzer as in claim 1 and further comprising a laser for producing said optical beam.

3. A spectrum analyzer as in claim 2 wherein said laser is a diode laser comprising a laser diode.

4. A spectrum analyzer as in claim 1 wherein said light detecting means is configured to modulate said optical beam within said laser diode.

5. A spectrum analyzer as in claim 4 wherein said modulator means is configured to modulate said optical beam within said laser diode.

6. A spectrum analyzer as in claim 1 wherein said modulating means comprises an electro-optic modulator.

7. A spectrum analyzer as in claim 6 wherein said electro-optic modulator is a Mach-Zender type modulator.

8. A spectrum analyzer as in claim 1 wherein said frequency direction filter means comprises an etalon.

* * * * *